US006541992B2

(12) United States Patent
Wei et al.

(10) Patent No.: US 6,541,992 B2
(45) Date of Patent: Apr. 1, 2003

(54) APPARATUS AND METHOD FOR CONTINUITY TESTING OF POGO PINS IN A PROBE

(75) Inventors: Richard Wei, Hsinchu (TW); Liza Chen, Hsinchu (TW)

(73) Assignee: Promos Technologies Inc., Hsinchu (TW)

(*) Notice: Subject to any disclaimer, the term of this patent is extended or adjusted under 35 U.S.C. 154(b) by 0 days.

(21) Appl. No.: 09/944,722

(22) Filed: Sep. 4, 2001

(65) Prior Publication Data

US 2003/0042887 A1 Mar. 6, 2003

(51) Int. Cl.$^7$ ............................................. G01R 31/02
(52) U.S. Cl. ..................................... 324/761; 324/158.1
(58) Field of Search ................................ 324/761, 537, 324/538, 754–765, 158.1, 522, 523, 545; 340/662, 663, 657

(56) References Cited

U.S. PATENT DOCUMENTS 3,849,728 A * 11/1974 Evans ........................ 324/758
5,477,152 A * 12/1995 Hayhurst ..................... 324/542

* cited by examiner

*Primary Examiner*—Kamand Cuneo
*Assistant Examiner*—Minh N. Tang
(74) *Attorney, Agent, or Firm*—Birch, Stewart, Kolasch & Birch, LLP

(57) ABSTRACT

An apparatus for continuity testing of a pogo pin in a probe comprises a substrate having a pad, a power supply providing a voltage difference between the pad and the pogo pin, and a sensing device signaling when the substrate contacts the probe, and a current is generated by the connection of the pogo pin and the pad.

12 Claims, 4 Drawing Sheets

APPARATUS AND METHOD FOR CONTINUITY TESTING OF POGO PINS IN A PROBE

BACKGROUND OF THE INVENTION

1. Field of the Invention

The present invention relates to an apparatus and method for continuity testing of pogo pins, particularly to an apparatus and method for continuity testing of pogo pins in a probe for semiconductor device testing.

2. Description of the Prior Art

FIG. 1 is a diagram showing a probe for semiconductor device testing. A probe 1 comprises circularly arranged pogo pins 11 and 12 which provide ground and test signals to a wafer being tested (not shown) respectively. Since the elasticity of the pogo pins 11 and 12 may be worn, which results in a contact fault, a continuity test of the pogo pins 11 and 12 is needed before the wafer can be tested using the probe.

Conventionally, the continuity test is implemented with the wafer under test put in the probe 1, a probe card and a test head mounted on the pogo pins 11 and 12. The results of the continuity test appear on a screen of the test head.

However, there are several drawbacks to the conventional continuity test method.

1. Contact faults of the pogo pins 11 for ground signals cannot be detected since all of them are electrically connected in the probe 1.
2. Alignment of the wafer under each test is necessary. Thus makes the continuity test time-consuming.
3. The operator must check hundreds of results appearing on the screen of the test head and a refresh of the results takes 1~2 seconds due to the long response time of analog-to digital converters.

There is an alternative method for continuity testing, wherein a sheet of carbon paper is applied to the pogo pins and the operator can detect failed pogo pins by inspecting the imprints on the carbon paper. This method, however, introduces carbon contamination to the pogo pins and the probe.

SUMMARY OF THE INVENTION

Therefore, the object of the present invention is to provide an apparatus and method for continuity testing of pogo pins in a probe, in which the wafer, probe card and test head are not necessary and the operator can easily identify the failed pogo pins.

The present invention provides an apparatus for continuity testing of a pogo pin in a probe. The apparatus comprises a substrate having a pad, a power supply providing a voltage difference between pad and pogo pin, and a sensing device signaling when the substrate contacts the probe and a current is generated by connection of the pogo pin and the pad.

The present invention further provides a method for continuity testing of a pogo pin in a probe. The method comprises the steps of providing a substrate having a pad, generating a voltage difference between the pad and the pogo pin, placing the substrate into the probe, and signaling when a current is generated by connection of the pogo pin and the pad.

In the present invention, LEDs are used to detect contact faults between the pogo pins and the pads. The failed pogo pins do not form closed loops in which currents are generated by the voltage difference. The LEDs corresponding to the failed pogo pins remain unlit.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE INVENTION

Figure 1:
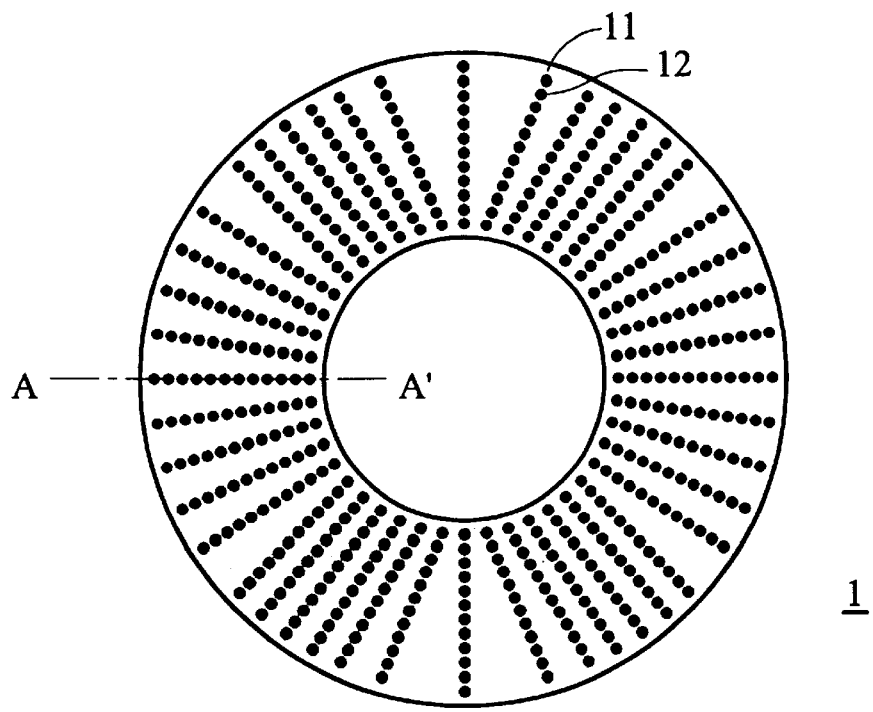
FIG. 1 is a diagram showing a probe for semiconductor device testing.
Figure 2:
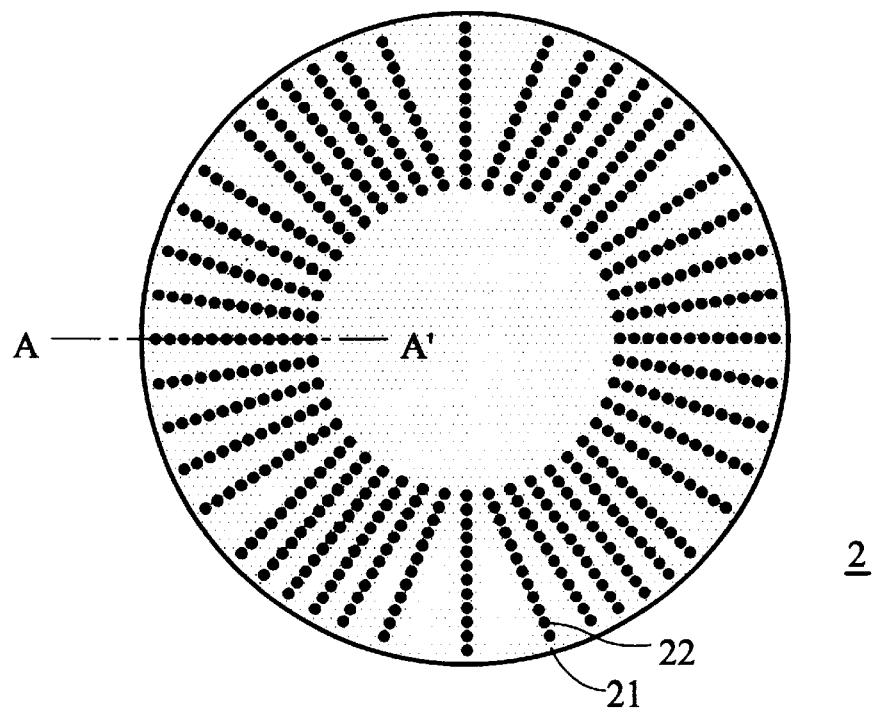
FIG. 2 is a diagram showing an apparatus for continuity testing of a pogo pin in a probe according to one embodiment of the invention.

FIG. 2 is a diagram showing an apparatus for continuity testing of a pogo pin in a probe according to one embodiment of the invention. A continuity test apparatus 2 comprises circularly arranged LEDs 22 corresponding to the pogo pins 11 and 12 shown in FIG. 1. The LEDs 22 are all mounted on a substrate 21 to signal contact faults of the pogo pins 11 and 12.

Figure 3:
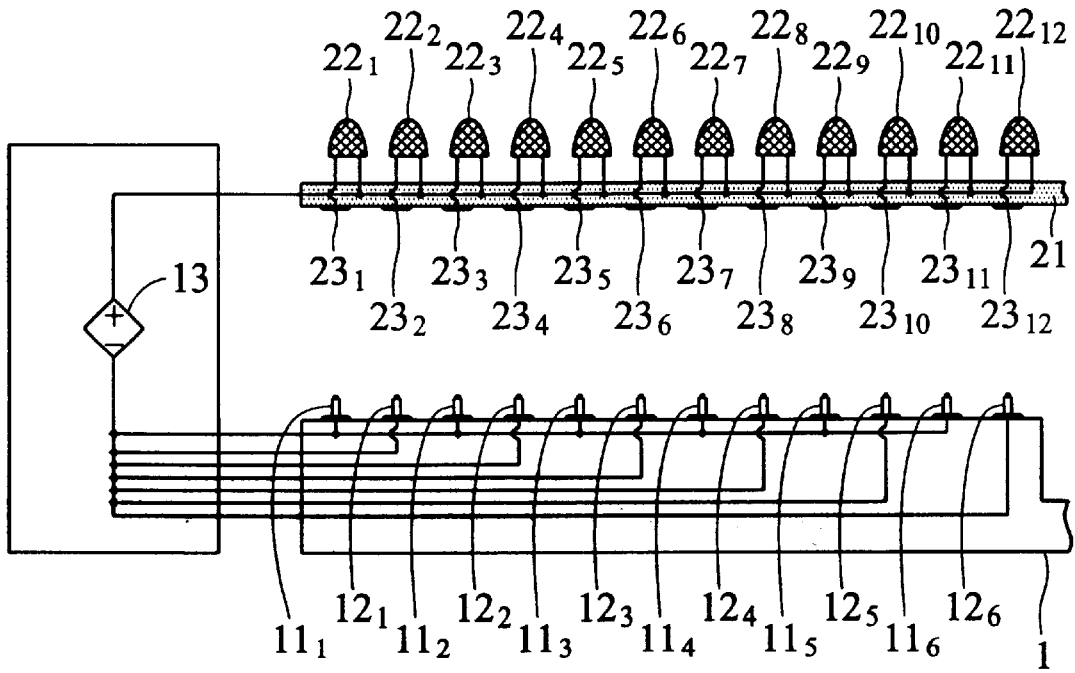
FIGS. 3~6 are cross-sectional diagrams showing an apparatus for continuity testing of a pogo pin in a probe according to one embodiment of the invention.

FIG. 3 is a cross-sectional diagram cut along the line AA' in FIG. 2. The substrate 21 comprises pads 23 corresponding to the pogo pins 11 and 12 on the opposite side of the LEDs 22. Pads 23 are electrically connected to the negative terminals of corresponding LEDs 22 through via holes (not shown). The positive terminals of the LEDs are electrically connected together through conducting traces (not shown) laid on the substrate 21.

A power supply 13 in a tester is connected between the pogo pins 11 and 12, and the LEDs 22 to generate a voltage difference 2V between the pogo pins 11, 12 and the LEDs 22.

Figure 4:
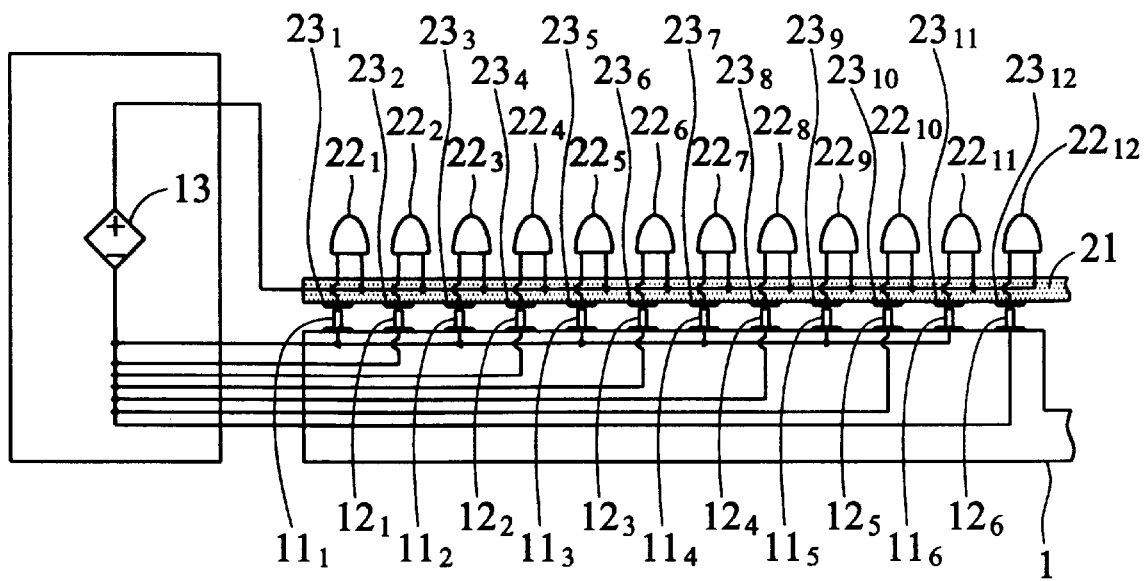

Please refer to FIG. 4, in which the substrate 21 is mounted on the probe 1 and brought into contact with the pogo pins 11 and 12 so that the pads 23 of the substrate 21 contact the corresponding pogo pins 11 and 12. Close loops are formed among the power supply 13, LEDs 22, pads 23 and pogo pins 11 and 12. The voltage difference results in currents flowing through the loops, which light the LEDs 22.

Figure 5:
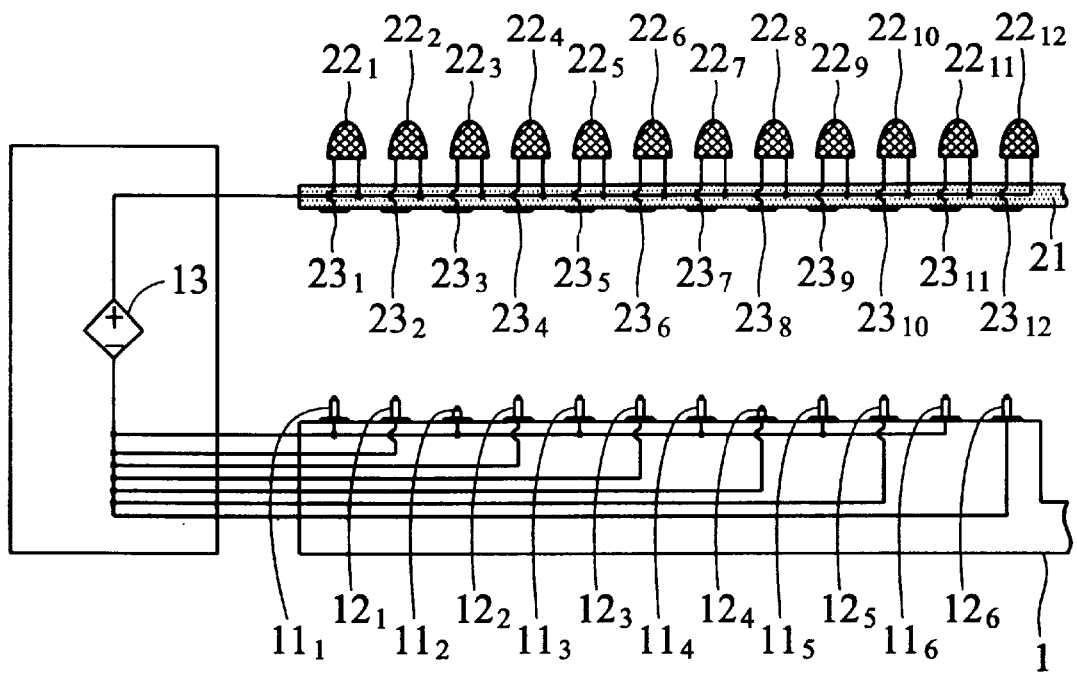

Please refer to FIG. 5, in which pogo pins 112 and 124 fail. They are shorter than the others due to lack of elasticity.

Figure 6:
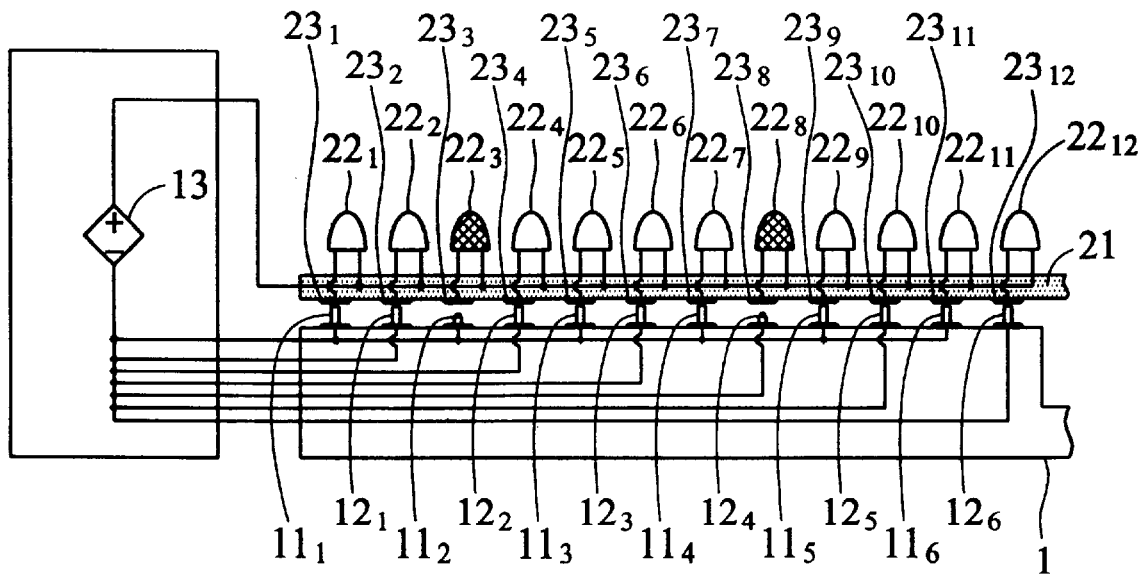

Please refer to FIG. 6, in which a continuity test is implemented with the failed pogo pins $11_2$ and $12_4$. There are contact faults between the pad $23_3$ and pogo pin $11_2$, and the pad $23_8$ and pogo pin $12_4$. The pogo pins $11_2$ and $12_4$ are apart from the pads $23_3$ and $23_8$. The closed loops among the power supply 13, LED $22_3$, pad $23_3$ and pogo pin $11_2$, and the power supply 13, LED $22_8$, pad $23_8$ and pogo pin $12_4$ are not completed. Thus, the LEDs 22 are lit except for the LEDs $22_3$ and $22_8$. Accordingly, the operator can easily identify the failed pogo pins as $11_2$ and $12_4$.

The previously described LEDs 22 are used to detect the formation of the closed loops by sensing the currents in the loops. They can be electrically connected between any two of the LED, the pad and the pogo pin.

Figure 7:
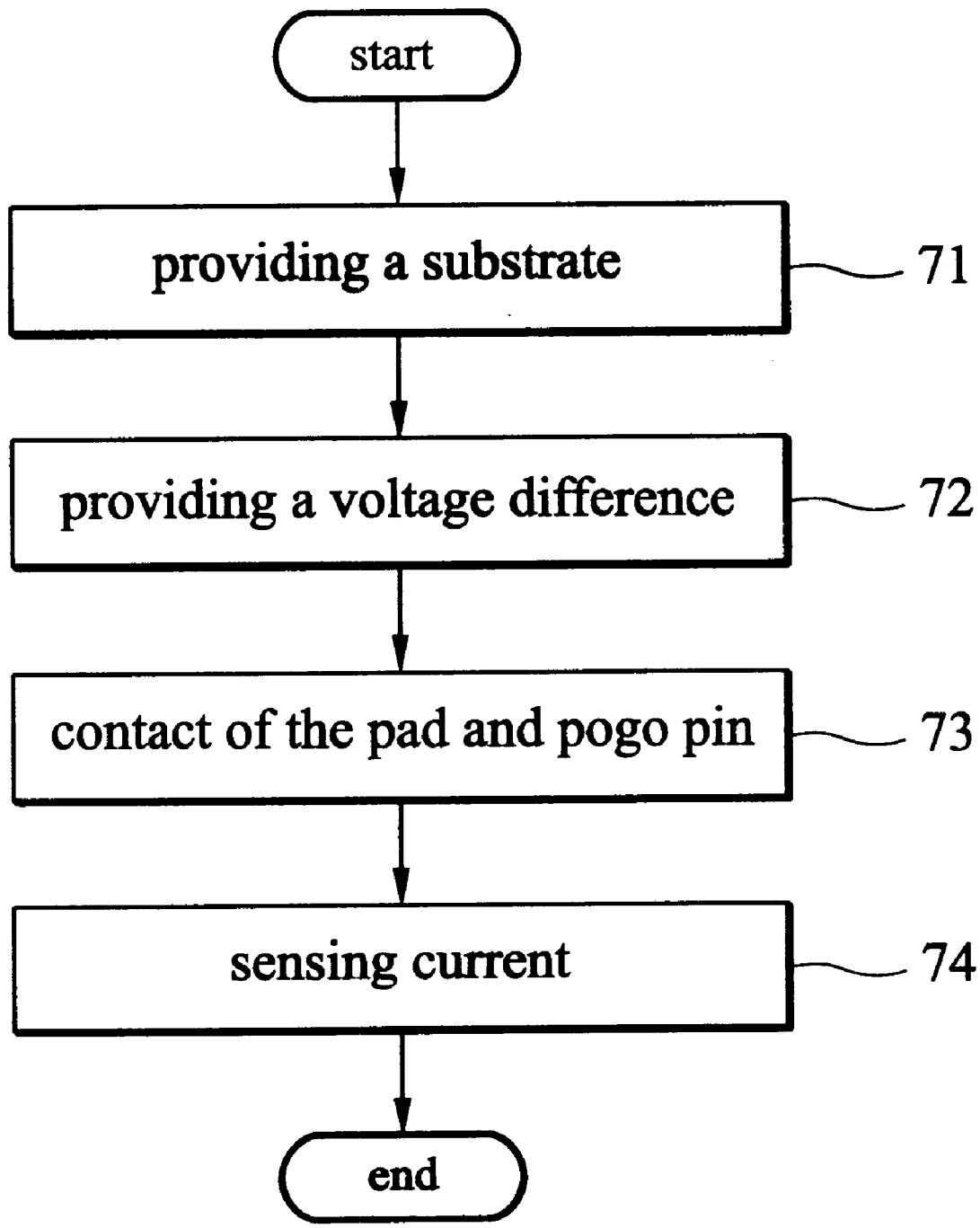
FIG. 7 is a flowchart of a method for continuity testing of a pogo pin in a probe according to one embodiment of the invention.

FIG. 7 is a flowchart of a method for continuity testing of pogo pins in a probe according to one embodiment of the invention.

In step 71, a substrate is provided, which has pads corresponding to the pogo pins and via holes through which the pads electrically connected to terminals.

In step 72, a voltage difference is generated between the terminals and the pogo pins.

In step 73, the substrate is mounted on the probe so that the pads contact the normal pogo pins forming closed loops. The failed pogo pins are apart from the pads, resulting in incomplete loops.

In step 74, LEDs corresponding to the pogo pins are connected to sensor currents in the closed and open loops. The pogo pins' contact with the pads results in the currents lighting the corresponding LEDs, while the failed pogo pins result in no current, with the corresponding LEDs remaining unlit.

In conclusion, the present invention provides a substrate with LEDs for implementation of the continuity test, whereby the operator can easily identify the failed pogo pins thus the wafer, probe card and test head used in the conventional method are not required.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims must be accorded the broadest interpretation so as to encompass all such modifications and similar arrangements.

What is claimed is:

1. An apparatus for continuity testing of a pogo pin in a probe, comprising:

a substrate having a pad;

a power supply providing a voltage difference between the pad and the pogo pin; and a sensing device generating a first signal when the substrate is mounted on the probe and the pogo pin contacts the pad, and generating a second signal when the substrate is mounted on the probe and the pogo pin is apart from the pad.

2. The apparatus as claimed in claim 1 wherein the sensing device is electrically connected between the pad and the power supply.

3. The apparatus as claimed in claim 1 wherein the sensing device is an LED.

4. The apparatus as claimed in claim 1 wherein the power supply is in a tester.

5. The apparatus as claimed in claim 1 wherein the sensing device is on the substrate.

6. The apparatus as claimed in claim 5 wherein the substrate has a via hole through which the sensing device is electrically connected to the pad.

7. A method for continuity testing of a pogo pin in a probe, comprising the steps of:

providing a substrate having a pad;

generating a voltage difference between the pad and the pogo pin;

mounting the substrate on the probe; and generating a first and second signal when the pogo pin contacts the pad and when the pogo pin is apart from the pad, respectively.

8. The method as claimed in claim 7 wherein the voltage difference is generated by a power supply, the method further comprising the step of:

sensing a current by a device connected between the pad and the power supply.

9. The method as claimed in claim 8 wherein the sensing device is an LED.

10. The method as claimed in claim 8 wherein the sensing device is on the substrate.

11. The method as claimed in claim 10 wherein the substrate has a via hole through which the sensing device is electrically connected to the pad.

12. The method as claimed in claim 7 wherein the power supply is in a tester.

* * * * *